United States Patent [19]

Wilson

[11] Patent Number: 4,942,059

[45] Date of Patent: Jul. 17, 1990

[54] METHOD FOR HARDFACING METAL ARTICLES

[75] Inventor: Ian L. W. Wilson, Murrysville, Pa.

[73] Assignee: Westinghouse Electric Corp., Pittsburgh, Pa.

[21] Appl. No.: 250,659

[22] Filed: Sep. 29, 1988

[51] Int. Cl.$^5$ .............................................. B05D 3/06
[52] U.S. Cl. ................................. 427/53.1; 148/20.3; 148/16.6; 219/76.1; 219/121.14; 219/121.64; 219/121.46; 428/662
[58] Field of Search ...................... 148/20.3; 427/53.1; 219/121.46, 121.64, 121.14, 76.1; 428/662

[56] References Cited

U.S. PATENT DOCUMENTS 3,503,787 3/1970 Pendse ............................... 148/20.3
4,244,751 1/1981 Hioki ................................. 148/20.3

Primary Examiner—Sam Silverberg

[57] ABSTRACT

The present invention provides a method for applying a hardface alloy coating on a metal substrate concurrently with a nitriding procedure so that the hardface coating is deposited and nitrided in one step. The deposition of the metal hardface coating is conducted in an atmosphere of nitrogen under nitriding conditions. The single step of metal deposition and nitriding is made possible by using a hardface alloy composition containing 20–75% niobium, 5–35% titanium and 10–60% tungsten.

5 Claims, No Drawings

METHOD FOR HARDFACING METAL ARTICLES

BACKGROUND OF THE INVENTION

1. Field of the Invention

The present invention relates to methods for hardfacing various types of metal objects such as tools, bearing surfaces, seals, valve seats, turbine blades, nozzles and the like. In particular, the invention is directed toward a method for applying a hardface metal alloy coating of the type wherein a nitriding step is used to enhance the hardfacing and corrosion resistant properties of the hardfacing metal or alloy.

2. Description of Related Art

Various types of hardfacing operations are known in the art. Typically these operations utilize a hardfacing alloy as an overlay on a structural material where increased resistance to wear is desired. The methods of applying the hardfacing alloy are well known and include welding, such as oxyfuel gas welding, and arc welding; spraying such as plasma spraying; brazing of preformed pieces and laser procedures such as laser alloying, laser cladding and laser melt/particle injection procedures.

A wide variety of hardfacing materials are currently available to suit the particular needs of articles which are subjected to abrasive and corrosive environments. Conventional hardfacing materials include metal carbides, cobalt-based alloys, nickel based alloys, iron based alloys and copper based alloys.

The abrasion and corrosion resistant properties of some hardfacing materials is improved by nitriding the hardfacing material after it has been applied to the substrate metal. For example, U.S. Pat. No. 3,827,920 discloses a method for forming a wear-resistant surface on a metal article which comprises coating a self-fluxing alloy onto the surface of a base metal and subjecting the coating to a nitriding treatment. Likewise, U.S. Pat. No. 3,829,260 discloses an improved wear-resistant metal object which is formed by coating a base metal with an alloy and then, if desired, nitriding the coated article to form a nitrided hardened layer on the object. Similarly, U.S. Pat. No. 3,801,381 discloses alloys which can be coated onto a base metal substrate and then subjected to a nitriding step.

All of the prior art hardfacing procedures which involve a nitriding step, require that the process be carried out in two steps; the first step being the deposition of the hardfacing material and the second step being the subsequent nitriding of the deposited hardfacing material. Consequently, the two step procedure requires more costly equipment and a greater expenditure of time, effort and money than would be required if the entire hardfacing deposition and nitriding procedure could be carried out in a single process step. However, no one has developed any process wherein the hardfacing deposition and nitriding can be carried out concurrently in a single process. Thus, a long felt need in the art exists to consolidate these two process steps into a single operation so as to avoid the disadvantages associated with separate hardfacing deposition and nitriding procedures.

SUMMARY OF THE INVENTION

The present invention solves the problem of the prior art methods by providing a hardfacing operation which can be conducted in a nitrogen or nitrogen-bearing atmosphere so that the nitriding operation is conducted concurrently with metal deposition.

It is a principal object of this invention to provide an improved hardfacing procedure wherein metal deposition and nitriding are performed concurrently.

It is also an object of this invention to provide a hardfaced article which is resistant to abrasion and corrosion.

These and other objects of the invention will become apparent to those skilled in the art from the following disclosure of the invention. The objects of the present invention are achieved by the discovery that the selection of a particular alloy in a hardfacing operation results in an unexpected advantage which allows the metal deposition step to be carried out concurrently with a nitriding step.

The alloy which is used in the present invention is a ternary alloy containing niobium, titanium and tungsten. The relative amounts of each constituent element in the alloy can vary considerably and still maintain its ability to be coated onto a base metal concurrently with a nitriding procedure. Preferably the alloy contains about 20–75% niobium, 5–30% titanium and 10–60% tungsten. Unless indicated otherwise, all percentages given in this specification are percentages by weight.

A particularly suitable alloy contains 50% niobium, 30% titanium and 20% tungsten. The most preferred alloy (50Nb-30Ti-20W) is commercially available and sold by Fansteel Inc. under the trademark "Tribocor 532N". Accordingly, it can be readily appreciated with the above objects in view, that the present invention resides in a hardfacing procedure wherein a ternary alloy containing Nb, Ti, and W is coated onto a metal substrate under nitriding conditions in an atmosphere containing nitrogen.

The method of depositing the metal alloy onto the substrate metal may be any of the known procedures currently in use for applying hardfacing material on metal substrates. The only requirement is that the coating be applied under a nitriding atmosphere and that the metal object be subjected to conventional nitriding conditions at least during some point during the coating operation so that the nitriding is conducted concurrently with the coating operation.

Many different types of materials may be hardfaced by the present invention. The hardfacing materials are applied to those areas where wear is a significant mechanism such as in valve seats, shaft seals and the mating shaft surface, journals, erosion shields and tool bits. These materials have excellent resistance to all forms of abrasive wear and in many applications should be resistant to shock. They are applied to base alloys whose properties (strength, corrosion resistance, toughness and cost) are sufficient for all other requirements except wear and in some cases extreme corrosion conditions. Typically, metals which may be coated in accordance with this invention include iron and steel.

The alloy used as the hardfacing material in this invention, particularly the "Tribocar 532N" exhibits superior abrasive wear performance to the cemented tungsten carbides. Excellent corrosion toughness and thermal shock resistance are also exhibited. The excellent wear properties are only realized after surface nitriding. This alloy is currently used as a wrought product in the manufacture of components.

DETAILED DESCRIPTION OF THE INVENTION AND PREFERRED EMBODIMENTS

The alloy which is used in the present invention is a ternary alloy containing niobium, titanium and tungsten. The relative amount of each element may vary considerably. Preferably, the alloy contains about 20–75% niobium, 5–30% titanium and 10–60% tungsten. Alloys which are outside of the preferred compositional range show limited performance when nitrided. For example, compositions having less than 10 percent tungsten exhibit lower strength since there is less refractory metal matrix to support the hard nitride phase. Likewise, compositions which are richer in titanium than those in the preferred composition (i.e., having more than 35%) develop a coarser nitride structure resulting in inferior mechanical performance.

A particularly preferable alloy is one having 50% Nb, 30% Ti and 20% W. This alloy is commercially available from Fansteel Inc. and is sold under the trademark "Tribocor 532N". This alloy is described in an article entitled "Tribocor 532N - A new material for environments involving wear and corrosion" (Journal of Materials for Energy Systems; Vol. 8; No. 1; June, 1986) the content of which is incorporated herein by reference.

In some uses, the performance of the nitrided alloy may be improved by substituting certain elements in place of the niobium, titanium or tungsten. For example, zirconium or hafnium may be substituted for part of the titanium to improve the high temperature properties and oxidation resistance of the nitride phase. Likewise, tantalum may be substituted for niobium or molybdenum may be substituted for tungsten to increase corrosion resistance in certain environments.

The alloy may be coated onto a base metal substrate by any conventional technique such as those used for other refractory metal alloys. Suitable methods of coating a hardfaced material onto a metal substrate are well known and are described in various publications. For example, processes are described in the "Metals Handbook"; 9th Ed.; Vol. 1, 1978; pp. 771–803 the content of which is incorporated herein by reference. Additional methods for applying a hard metallic coating on a metal substrate are described in U.S. Pat. Nos. 3,640,689 and 2,757,445, the specifications of which are incorporated herein by reference. Particular coating processes which are useful in the present invention include those using wire, strip or powder such as conventional welding or plasma spraying. It is particularly desirable to use a laser coating process to apply the hardfacing material onto a metal object.

The most significant aspect of the present invention resides in the fact that the hardface coating operation can be conducted under nitriding conditions when using the above described ternary alloy within the compositional ranges specified herein. Thus, the metal coating operation is conducted in a nitrogen containing atmosphere under nitriding conditions.

Suitable conditions for nitriding metals and metal coatings are well known. For example, nitriding processes are described in the "Metals Handbook" edited by Taylor Lyman and published by the American Society for Metals, 1948; at pages 697–702; the content of which is incorporated herein by reference. Nitriding methods are also described in U.S. Pat. Nos. 1,908,887; 2,578,197; 3,549,429; 3,642,546; 4,026,730 and 4,451,302, the specifications of which are incorporated herein by reference. In addition, the nitriding of metal coatings are described in U.S. Pat. Nos. 3,801,381; 3,827,920 and 3,829,260, the specifications of which are incorporated herein by reference.

The preferred alloy (50Nb-30Ti-20W) is easily nitrided concurrently with the conventional coating processes described above. Preferably, the coating is nitrided at temperatures above 1250° C. It has been observed that nitriding the preferred alloy above 1250° C. allows the coating to develop surface hardness which exceeds that of cemented carbides and to develop superior corrosion resistance. It has also been observed that the preferred alloy can be nitrided over a temperature range of 1350° C. to at least 1900° C. Within this temperature range, the alloy exhibits a classical parabolic rate relationship between weight gain and time.

It will be readily appreciated that the metal coating which is nitrided concurrently with the coating procedure is applied to the surface of a metal object. This does not preclude the possibility that the metal object may have one or more layers of hardfacing metal applied thereto before an additional layer or layers of hardfacing metal are applied concurrently with the nitriding procedure. Thus, in one embodiment, it is the final layer or layers which are laid down under nitrogen shielding to produce in situ nitriding.

The following description illustrates an example of a preferred embodiment of the invention.

An alloy containing 50% Nb, 30% Ti and 20% W by weight is used in the form of a powder to coat the area of a metal object such as a steel object. The powder is fed to the area to be coated at which time the powder is melted and welded to the substrate using a laser process with a nitrogen or nitrogen bearing gas blanket around the molten metal pool. During the coating process, nitriding conditions are maintained so that the coating is nitrided concurrently with the coating process.

In other embodiments of the invention, matching of the thermal expansion coefficient between the substrate and the nitrided surface is achieved by laying down a non-nitrided primary layer or layers of hardfacing material while obtaining some mixing of the hardfacing alloy at the interface between the base metal and hardfacing alloy and then applying a final layer or layers of hardfacing alloy in a nitrogen bearing environment maintained under nitriding conditions in order to build up a hard-nitrided layer to the required depth.

While the present invention has been described in terms of certain preferred embodiments and exemplified with respect thereto, one skilled in the art will readily appreciate that variations, modifications, changes, omissions and substitutions may be made without departing from the spirit thereof. It is intended, therefore, that the present invention be limited solely by the scope of the following claims.

What is claimed:

1. A method for applying a nitrided metal hardface coating on a metal object which comprises applying a coating of an alloy onto a metal object in an atmosphere containing nitrogen under nitriding conditions whereby the coating of the object and nitriding of the coating occur concurrently; said alloy containing 20–75% niobium, 5–35% titanium and 10–60% tungsten.

2. The method of claim 1 wherein the alloy contains about 50% niobium, 30% titanium and 20% tungsten.

3. The method of claim 1 which further comprises the step of applying at least one intermediate layer of the alloy onto the metal object; said intermediate layer being situated between the surface of the metal object and the nitrided hardface coating and said intermediate layer being applied under non-nitriding conditions.

4. The method of claim 3 wherein the alloy contains about 50% niobium, 30% titanium and 20% tungsten.

5. A method for applying a nitrided metal hardface coating on a metal object which comprises applying a coating of an alloy onto the metal object in an atmosphere containing nitrogen under nitriding conditions whereby the coating of the object and nitriding of the coating occur concurrently; said alloy containing 20–75% of an element selected from the group consisting of niobium, tantalum, and mixtures thereof; 5–30% of an element selected from the group consisting of titanium, zirconium, hafnium, and mixtures thereof; and 5–30% of an element selected from the group consisting of tungsten, molybdenum and mixtures thereof.

* * * * *